US009444035B2

(12) United States Patent
Park et al.

(10) Patent No.: US 9,444,035 B2

(45) Date of Patent: Sep. 13, 2016

(54) MAGNESIUM OXIDE CAPPING WITH A SHORTED PATH FOR PERPENDICULAR MAGNETIC TUNNEL JUNCTION DEVICES AND METHOD FOR FABRICATION

(71) Applicant: QUALCOMM Incorporated, San Diego, CA (US)

(72) Inventors: Chando Park, San Diego, CA (US); Kangho Lee, San Diego, CA (US); Jimmy Kan, San Diego, CA (US); Matthias Georg Gottwald, Leuven (BE); Xiaochun Zhu, San Diego, CA (US); Seung Hyuk Kang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/483,104

(22) Filed: Sep. 10, 2014

(65) Prior Publication Data

US 2016/0072043 A1 Mar. 10, 2016

(51) Int. Cl.

*H01L 29/82* (2006.01)
*H01L 43/02* (2006.01)
*H01L 43/12* (2006.01)
*H01L 43/08* (2006.01)

(52) U.S. Cl.

CPC ............... *H01L 43/02* (2013.01); *H01L 43/08* (2013.01); *H01L 43/12* (2013.01)

(58) Field of Classification Search

CPC ... H01L 51/56; H01L 33/62; H01L 51/0072; H01L 2251/301; H01L 43/08

USPC .............................................. 257/421; 438/3

See application file for complete search history.

(56) References Cited

U.S. PATENT DOCUMENTS

| | | | |
|---|---|---|---|
| 7,054,115 B2 | 5/2006 | Hasegawa et al. | |
| 8,270,208 B2 | 9/2012 | Gaidis et al. | |
| 8,592,927 B2 | 11/2013 | Jan et al. | |
| 8,698,260 B2 * | 4/2014 | Jan | H01L 43/08 257/421 |
| 2010/0315863 A1 | 12/2010 | Zhu et al. | |
| 2011/0235217 A1 | 9/2011 | Chen et al. | |
| 2013/0075845 A1 | 3/2013 | Chen et al. | |
| 2013/0221459 A1 * | 8/2013 | Jan | H01L 43/08 257/421 |
| 2013/0221460 A1 * | 8/2013 | Jan | H01L 43/10 257/421 |
| 2014/0070341 A1 | 3/2014 | Beach et al. | |
| 2014/0077318 A1 | 3/2014 | Kula et al. | |

OTHER PUBLICATIONS

Sato H., et al., "MgO/CoFeB/Ta/CoFeB/MgO Recording Structure in Magnetic Tunnel Junctions With Perpendicular Easy Axis", IEEE Transactions on Magnetics, vol. 49, No. 7, Jul. 2013, pp. 4437-4440.

International Search Report and Written Opinion—PCT/US2015/040987—ISA/EPO—Oct. 5, 2015.

* cited by examiner

*Primary Examiner* — Andy Huynh

(74) *Attorney, Agent, or Firm* — Seyfarth Shaw LLP

(57) ABSTRACT

A magnetic tunnel junction (MTJ) device includes a pinned layer, a tunnel barrier layer on the pinned layer, and a free layer on the tunnel barrier layer. The MTJ device also includes a perpendicular magnetic anisotropic (PMA) enhancement layer on the free layer, a capping layer on the PMA enhancement layer, and a conductive path electrically shorting the capping layer, the PMA enhancement layer and the free layer. A method of fabricating a perpendicular magnetic tunnel junction (pMTJ) device includes forming a capping layer, a perpendicular magnetic anisotropic (PMA) enhancement layer and a free layer. The method also includes forming a conductive layer to short the capping layer, the PMA enhancement layer and the free layer.

24 Claims, 7 Drawing Sheets

300
312
302
304
306
308
310
314

MAGNESIUM OXIDE CAPPING WITH A SHORTED PATH FOR PERPENDICULAR MAGNETIC TUNNEL JUNCTION DEVICES AND METHOD FOR FABRICATION

TECHNICAL FIELD

The present disclosure generally relates to magnetic tunnel junction (MTJ) devices. More specifically, the present disclosure relates to magnesium oxide (MgO) capping with a shorted path for perpendicular magnetic tunnel junction devices.

BACKGROUND

Unlike conventional random access memory (RAM) chip technologies, in magnetic RAM (MRAM) data is stored by magnetization of storage elements. The basic structure of the storage elements consists of metallic ferromagnetic layers separated by a thin tunneling barrier. Typically, the ferromagnetic layers underneath the barrier (e.g., the pinned layer) have a magnetization that is fixed in a particular direction. The ferromagnetic magnetic layers above the tunneling barrier (e.g., the free layer) have a magnetization direction that may be altered to represent either a "1" or a "0." For example, a "1" may be represented when the free layer magnetization is anti-parallel to the fixed layer magnetization. In addition, a "0" may be represented when the free layer magnetization is parallel to the fixed layer magnetization or vice versa. One such device having a fixed layer, a tunneling layer, and a free layer is a magnetic tunnel junction (MTJ). The electrical resistance of an MTJ depends on whether the free layer magnetization and fixed layer magnetization are parallel or anti-parallel to each other. A memory device such as MRAM is built from an array of individually addressable MTJs.

To write data in a conventional MRAM, a write current, which exceeds a critical switching current, is applied through an MTJ. Application of a write current that exceeds the critical switching current changes the magnetization direction of the free layer. When the write current flows in a first direction, the MTJ may be placed into or remain in a first state in which its free layer magnetization direction and fixed layer magnetization direction are aligned in a parallel orientation. When the write current flows in a second direction, opposite to the first direction, the MTJ may be placed into or remain in a second state in which its free layer magnetization and fixed layer magnetization are in an anti-parallel orientation.

To read data in a conventional MRAM, a read current may flow through the MTJ via the same current path used to write data in the MTJ. If the magnetizations of the MTJ's free layer and fixed layer are oriented parallel to each other, the MTJ presents a parallel resistance. The parallel resistance is different than a resistance (anti-parallel) the MTJ would present if the magnetizations of the free layer and the fixed layer were in an anti-parallel orientation. In a conventional MRAM, two distinct states are defined by these two different resistances of an MTJ in a bitcell of the MRAM. The two different resistances indicate whether a logic "0" or a logic "1" value is stored by the MTJ.

A dual interface (e.g., two interfaces between the free layer and the thin tunneling barrier that is typically an oxide such as magnesium oxide (MgO)) may be a significant element in the design of a perpendicular magnetic tunnel junction (pMTJ) stack. The dual interface can increase the perpendicular magnetic anisotropy (PMA) of a pMTJ and also reduce its damping constant. Generally, a certain MgO thickness is specified to provide a sufficient PMA.

For example, an MgO barrier may be used as a capping layer to provide an improvement in PMA without providing an improvement in the tunnel magneto-resistance (TMR). In this arrangement, the MgO capping layer thickness should be controlled to provide a resistance multiplied by area (RA) product that is less than that of the tunnel barrier to decrease the reduction in the TMR. However, this limitation may result in limited PMA improvement for a pMTJ.

SUMMARY

A magnetic tunnel junction (MTJ) device includes a pinned layer, a tunnel barrier layer on the pinned layer, and a free layer on the tunnel barrier layer. The MTJ device also includes a perpendicular magnetic anisotropic (PMA) enhancement layer on the free layer, a capping layer on the PMA enhancement layer; and a conductive path electrically shorting the capping layer, the PMA enhancement layer and the free layer.

A method of fabricating a perpendicular magnetic tunnel junction (pMTJ) device includes forming a capping layer, a perpendicular magnetic anisotropic (PMA) enhancement layer and a free layer. The method also includes forming a conductive layer to short the capping layer, the PMA enhancement layer and the free layer.

A magnetic tunnel junction (MTJ) device includes a pinned layer, a tunnel barrier layer on the pinned layer, and a free layer on the tunnel barrier layer. The MTJ device also includes a perpendicular magnetic anisotropic (PMA) enhancement layer on the free layer, a capping layer on the PMA enhancement layer and a means for electrically shorting the capping layer, the PMA enhancement layer and the free layer.

A method of fabricating a perpendicular magnetic tunnel junction (pMTJ) device includes the step of forming a capping layer, a perpendicular magnetic anisotropic (PMA) enhancement layer and a free layer. The method also includes the step of forming a conductive layer to short the capping layer, the PMA enhancement layer and the free layer.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
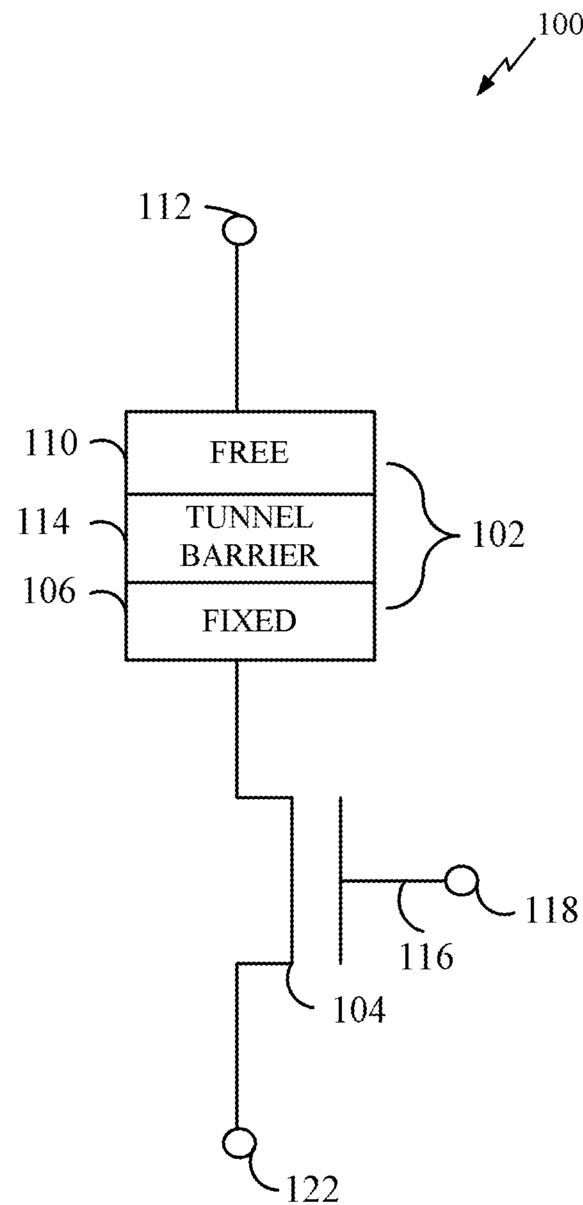
FIG. 1 is a diagram of a magnetic tunnel junction (MTJ) device connected to an access transistor.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

A dual interface (e.g., two interfaces between the free layer and the thin tunneling barrier, which may be an oxide such as magnesium oxide (MgO)) may be a significant element in the design of a perpendicular magnetic tunnel junction (pMTJ) stack. The oxide that makes up the thin tunneling barrier can be magnesium oxide (MgO), aluminum oxide (AlOx), hafnium oxide (HfOx), tantalum oxide (TaOx) or other like oxide. The dual interface can increase the perpendicular magnetic anisotropy (PMA) of a pMTJ and also reduce its damping constant. Generally, a certain MgO thickness is specified to provide a sufficient amount of perpendicular magnetic anisotropy.

For example, an MgO barrier may be used as a capping layer to provide an improvement in perpendicular magnetic anisotropy without providing an improvement in the tunnel magneto-resistance (TMR). In this arrangement, the MgO capping layer thickness should be controlled to provide a resistance multiplied by area (RA) product that is less than that of the tunnel barrier to reduce the reduction in the tunnel magneto-resistance. This limitation, however, may result in a limited amount of perpendicular magnetic anisotropy improvement for a pMTJ.

One way to remove this limitation is to add a conductive layer around the capping layer made of MgO. For example, because an MgO capping layer does not produce tunnel magneto-resistance, the conductive layer around the MgO capping layer after patterning (which can be considered as a short path) will significantly reduce the RA contribution from the MgO capping layer. Therefore, this MgO capping layer improves the perpendicular magnetic anisotropy without contributing to the RA product. This result can be achieved by a thin metal layer deposition after patterning, or by imposing an etching condition for the patterning.

Patterning the MTJ with etching can also induce re-deposited conductive material around the capping layer that may be used as a short path. The advantages provided by this method of forming a conductive layer around the capping layer include independent control of the capping layer for both the bottom-pinned or top-pinned pMTJ. This control of the capping layer is useful for tuning the magnetic properties of the pMTJ free layers.

FIG. 1 illustrates a memory cell 100 of a memory device including a magnetic tunnel junction (MTJ) 102 coupled to an access transistor 104. The memory device may be a magnetic random access memory (MRAM) device that is built from an array of individually addressable MTJs. An MTJ stack may include a free layer, a fixed layer and a tunnel barrier layer there between as well as one or more ferromagnetic layers. Representatively, a free layer 110 of the MTJ 102 is coupled to a bit line 112. The access transistor 104 is coupled between a fixed layer 106 of the MTJ 102 and a fixed potential node 122. A tunnel barrier layer 114 is coupled between the fixed layer 106 and the free layer 110. The access transistor 104 includes a gate 116 coupled to a word line 118.

Synthetic anti-ferromagnetic materials may form the fixed layer 106 and the free layer 110. For example, the fixed layer 106 may comprise multiple material layers including a cobalt-iron-boron (CoFeB) layer, a ruthenium (Ru) layer and a cobalt-iron (CoFe) layer. In addition, the free layer 110 may also include multiple material layers including a cobalt-iron-boron (CoFeB) layer, a ruthenium (Ru) layer and a cobalt-iron (CoFe) layer. Further, the tunnel barrier layer 114 may be magnesium oxide (MgO).

Figure 2:
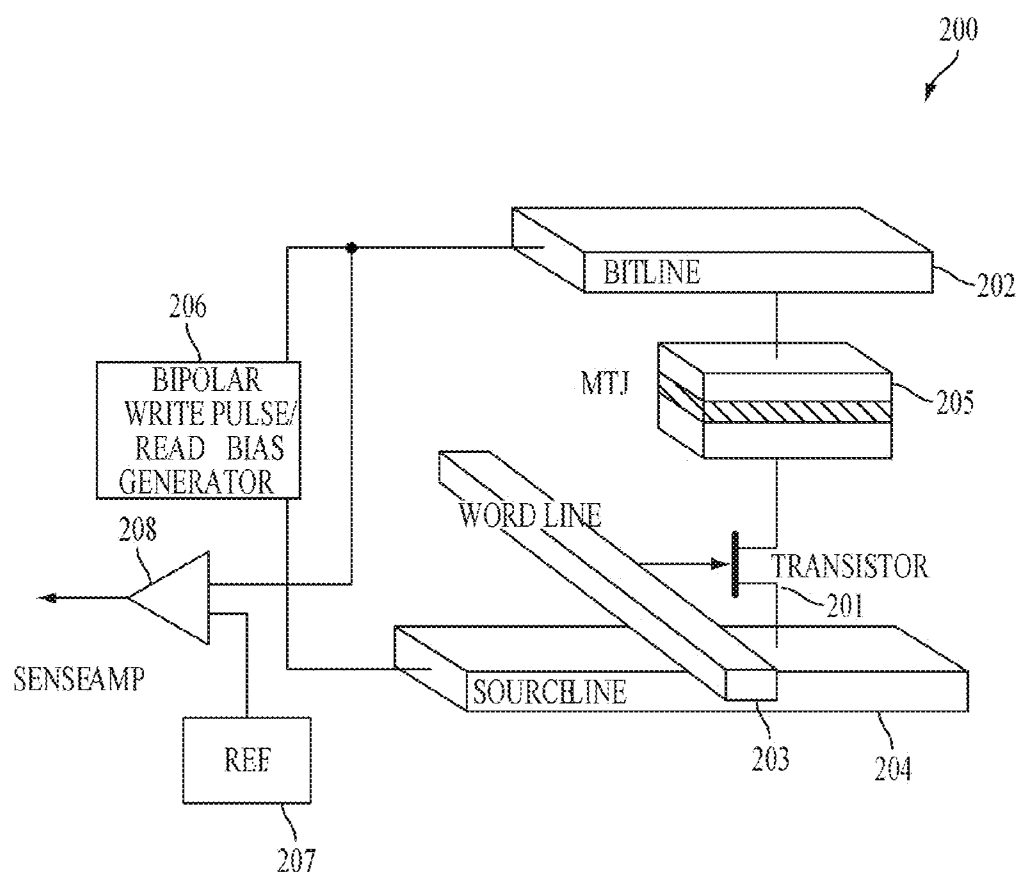
FIG. 2 is a conceptual diagram of a conventional magnetic random access memory (MRAM) cell including an MTJ.

FIG. 2 illustrates a conventional STT-MRAM bit cell 200. The STT-MRAM bit cell 200 includes a magnetic tunnel junction (MTJ) storage element 205, a transistor 201, a bit line 202 and a word line 203. The MTJ storage element 205 is formed, for example, from at least two ferromagnetic layers (a pinned layer and a free layer), each of which can hold a magnetic field or polarization, separated by a thin non-magnetic insulating layer (tunneling barrier). Electrons from the two ferromagnetic layers can penetrate through the tunneling barrier due to a tunneling effect under a bias voltage applied to the ferromagnetic layers. The magnetic polarization of the free layer can be reversed so that the polarity of the pinned layer and the free layer are either substantially aligned or opposite. The resistance of the electrical path through the MTJ varies depending on the alignment of the polarizations of the pinned and free layers. This variance in resistance may program and read the bit cell 200. The STT-MRAM bit cell 200 also includes a source line 204, a sense amplifier 208, read/write circuitry 206 and a bit line reference 207.

Figure 3A:
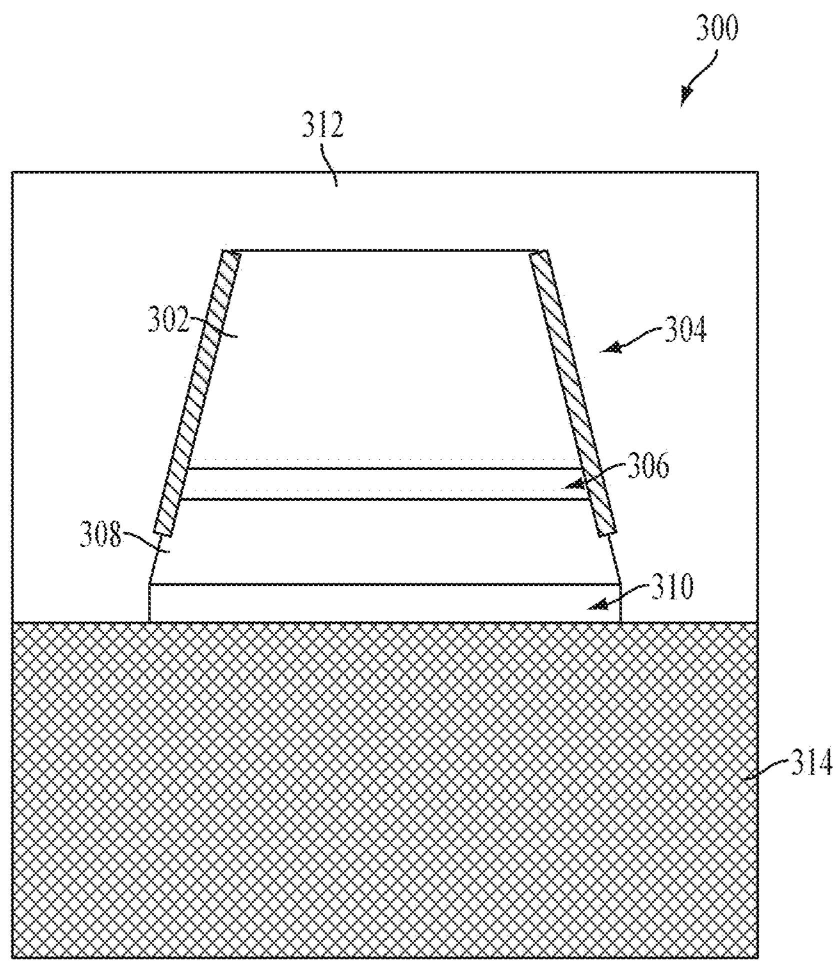
FIG. 3A is a cross-sectional view of magnesium oxide (MgO) capping with a shorted path for a magnetic tunnel junction (MTJ) structure according to aspects of the present disclosure.

FIG. 3A is a cross-sectional view of magnesium oxide (MgO) capping with a shorted path for a magnetic tunnel junction (MTJ) structure 300 according to aspects of the present disclosure. The MTJ structure 300 (e.g., MTJ device) includes an insulating layer 312 and a pinned layer 314. The insulating layer 312 surrounds a capping layer 302 (or a capping and top electrode), a conductive path 304, a PMA enhancement layer 306, a free layer 308 and a tunnel barrier layer 310. The insulating layer 312 may be a low k insulating material, such as silicon dioxide ($SiO_2$), or may be simply air or space. The MTJ structure 300 can be a perpendicular MTJ (pMTJ) device.

It should be appreciated that the various layers of the MTJ stack are provided merely for illustration and not for limitation. Additional layers may be added and/or layers may be removed or combined and may comprise different materials then illustrated.

As can be seen by FIG. 3A, the conductive path 304 is formed along at least one sidewall of the capping layer 302. The capping layer 302 is etched during the fabrication process o the MTJ structure 300.

The etching process for the capping layer 302 and the free layer 308 may inherently produce re-deposited materials. That is, leftover conductive material that results from etching builds up on the sidewalls of the capping layer 302 (and also the free layer 308). In this configuration, the buildup of the leftover conductive material eventually forms the conductive path 304. Therefore, the conductive path 304 may include re-deposited conductive material resulting from etching.

In another configuration, the conductive path 304 includes conductive material deposited after etching. For example, after the etching process, conductive material can be deposited over the sidewalls of the capping layer 302 and the free layer 308 to supplement any conductive path 304, which may have already built up. In yet another configuration, the conductive path 304 is engineered to be an electric short by various processes such as etching.

Figure 3B:
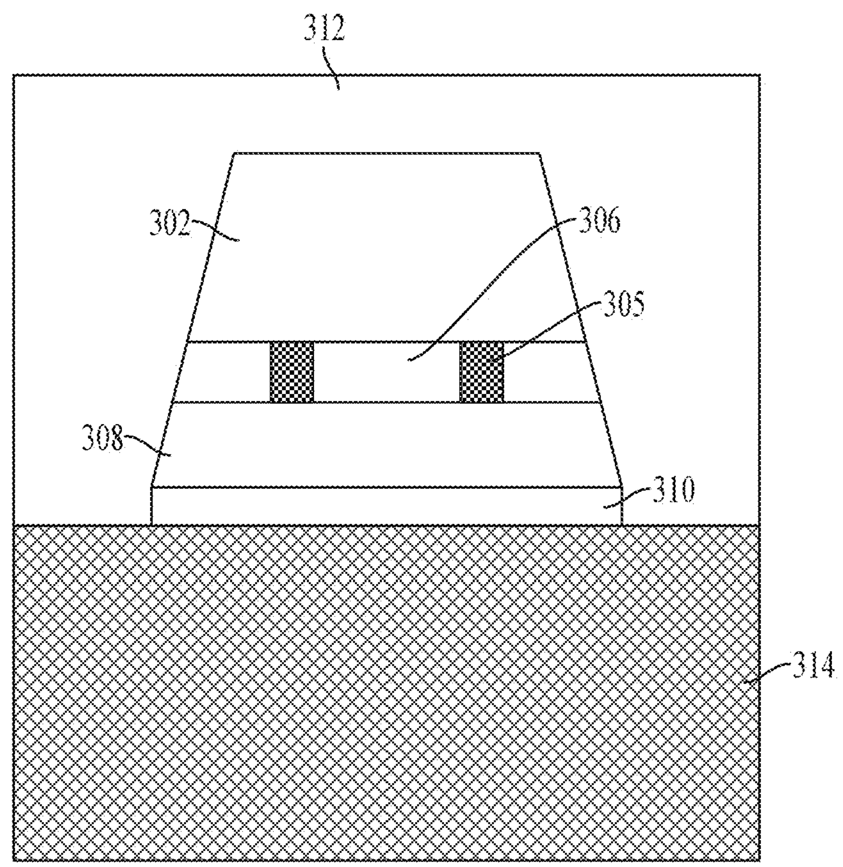
FIG. 3B is a cross-sectional view of magnesium oxide (MgO) capping with a via path for a magnetic tunnel junction (MTJ) structure according to aspects of the present disclosure.

In still another configuration (as seen in FIG. 3B), the conductive path 304 (see FIG. 3A) is provided by a set of vias 305. The vias 305 may be in addition to, or an alternative to, the conductive path 304 shown in FIG. 3A.

One aspect of the present disclosure provides independent control of MgO capping for both bottom-pinned and top-pinned pMTJs. In addition, the magnetic properties of pMTJ free layers can be tuned because these pMTJ free layer magnetic properties are related to the capping MgO thickness. This leads to high performance MRAMs by providing low damping as well as strong perpendicular magnetic anisotropy values. Furthermore, the etching processes used in fabrication may induce re-deposited materials inherently. As a result, previous designs may be used without having to build entirely new structures. Various applications for the device include implementing pMTJs into STT-MRAM arrays for non-volatile memory applications (e.g., storage, cache) and using such pMTJ devices for spin-based logic and computational applications (e.g., magnetic clocking, multi-bit gates).

The PMA enhancement layer 306 may be aluminum oxide ($Al_2O_3$), magnesium oxide (MgO), hafnium oxide ($HfO_2$) and/or tantalum oxide ($Ta_2O_5$). The PMA enhancement layer 306 mays also be a multilayer(s) that are based on a precious conductive material such as palladium or platinum with cobalt, or can be a 3d metal multilayer(s) based on a transition-conductive material like cobalt nickel or cobalt iron nickel.

The pinned layer 314 may include multiple material layers including a cobalt-iron-boron (CoFeB) layer, a ruthenium (Ru) layer and a cobalt-iron (CoFe) layer. In addition, the free layer 308 may also include multiple material layers including a cobalt-iron-boron (CoFeB) layer, a ruthenium (Ru) layer and a cobalt-iron (CoFe) layer. In addition, the tunnel barrier layer 310 may be magnesium oxide (MgO).

Figure 4:
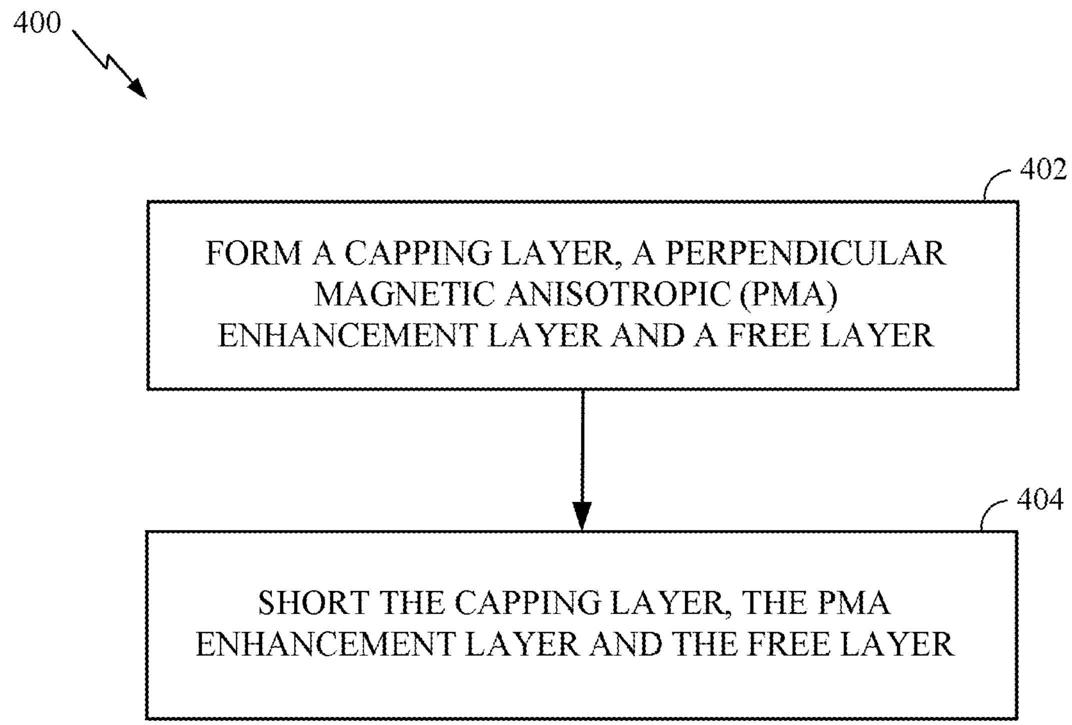
FIG. 4 is a process flow diagram illustrating a method of fabricating a pMTJ device according to aspects of the present disclosure.

FIG. 4 is a process flow diagram illustrating a method 400 of fabricating a pMTJ device according to aspects of the present disclosure. In block 402, a capping layer (e.g., capping layer 302), a perpendicular magnetic anisotropic (PMA) enhancement layer (e.g., PMA enhancement layer 306), and a free layer (e.g., free layer 308) are formed. In block 404, a conductive layer (e.g., conductive path 304) is formed to short the capping layer, the PMA enhancement layer, and the free layer. In case of vias, the conductive layer (e.g., via 305) is formed from the capping layer, through the PMA enhancement layer, to the free layer.

In one configuration, forming the conductive layer or conductive path includes etching the capping layer, the PMA enhancement layer, a tunnel barrier layer (e.g., tunnel barrier layer 310) and/or the free layer to induce re-depositing of the conductive layer on the capping layer, the PMA enhancement layer and the free layer. In another configuration, forming the conductive layer or conductive path includes depositing conductive material on the capping layer, the PMA enhancement layer and the free layer.

According to one aspect of the present disclosure, a magnetic tunnel junction (MTJ) device includes a pinned layer, a tunnel barrier layer on the pinned layer, a free layer on the tunnel barrier layer, a PMA enhancement layer on the free layer, a capping layer on the PMA enhancement layer and means for electrically shorting the capping layer, the PMA enhancement layer and the free layer. In one configuration, the shorting means is the conductive path 304. In another configuration, the shorting means is the via 305. In yet another configuration, the aforementioned means may be any material or any layer configured to perform the functions recited by the aforementioned means. Although specific means have been set forth, it will be appreciated by those skilled in the art that not all of the disclosed means are required to practice the disclosed configurations. Moreover, certain well known means have not been described, to maintain focus on the disclosure.

In one configuration, the conductive material used for the various conductive layers are copper (Cu), or other conductive materials with high conductivity. Alternatively, the conductive material may include copper (Cu), silver (Ag), annealed copper (Cu), gold (Au), aluminum (Al), calcium (Ca), tungsten (W), zinc (Zn), nickel (Ni), lithium (Li) or iron (Fe). The aforementioned conductive material layers may also be deposited by electroplating, chemical vapor deposition (CVD), physical vapor deposition (PVD), sputtering, or evaporation.

The PMA enhancement layer 306 may include aluminum oxide ($Al_2O_3$), magnesium oxide (MgO), hafnium oxide or hafnium (IV) oxide ($HfO_2$) and/or tantalum oxide or tantalum pentoxide ($Ta_2O_5$). The PMA enhancement layer 306 may also include multilayers based on a precious conductive material such as palladium or platinum, with cobalt, such as cobalt palladium (Co/Pa) or cobalt platinum (Co/Pt), or alloys of any of the previously listed materials. The PMA enhancement layer 306 may also include multilayers made from only 3d transition-conductive materials like cobalt nickel (Co/Ni) or cobalt iron/nickel (CoFe/Ni), or alloys of the previously listed materials.

Any insulating materials used in any of the aforementioned pMTJ structures such as the insulating layer 312 may be low k materials including silicon dioxide ($SiO_2$) and fluorine-doped, carbon-doped, and porous carbon-doped forms, as well as spin-on organic polymeric dielectrics such as polyimide, polynorbornenes, benzocyclobutene (BCB) and polytetrafluoroethylene (PTFE), spin-on silicone based polymeric dielectrics and silicon nitrogen-containing oxycarbides (SiCON).

Although not mentioned in the above process steps, photoresist, ultraviolet exposure through masks, photoresist development and lithography may be used. Photoresist layers may be deposited by spin-coating, droplet-based photoresist deposition, spraying, chemical vapor deposition (CVD), physical vapor deposition (PVD), sputtering, or evaporation. Photoresist layers may then be exposed and then etched by chemical etching processes using solutions such as Iron Chloride ($FeCl_3$), Cupric Chloride ($CuCl_2$) or Alkaline Ammonia ($NH_3$) to wash away the exposed photoresist portions, or dry etching processes using plasmas. Photoresist layers may also be stripped by a chemical photoresist stripping process or a dry photoresist stripping process using plasmas such as oxygen, which is known as ashing.

Figure 5:
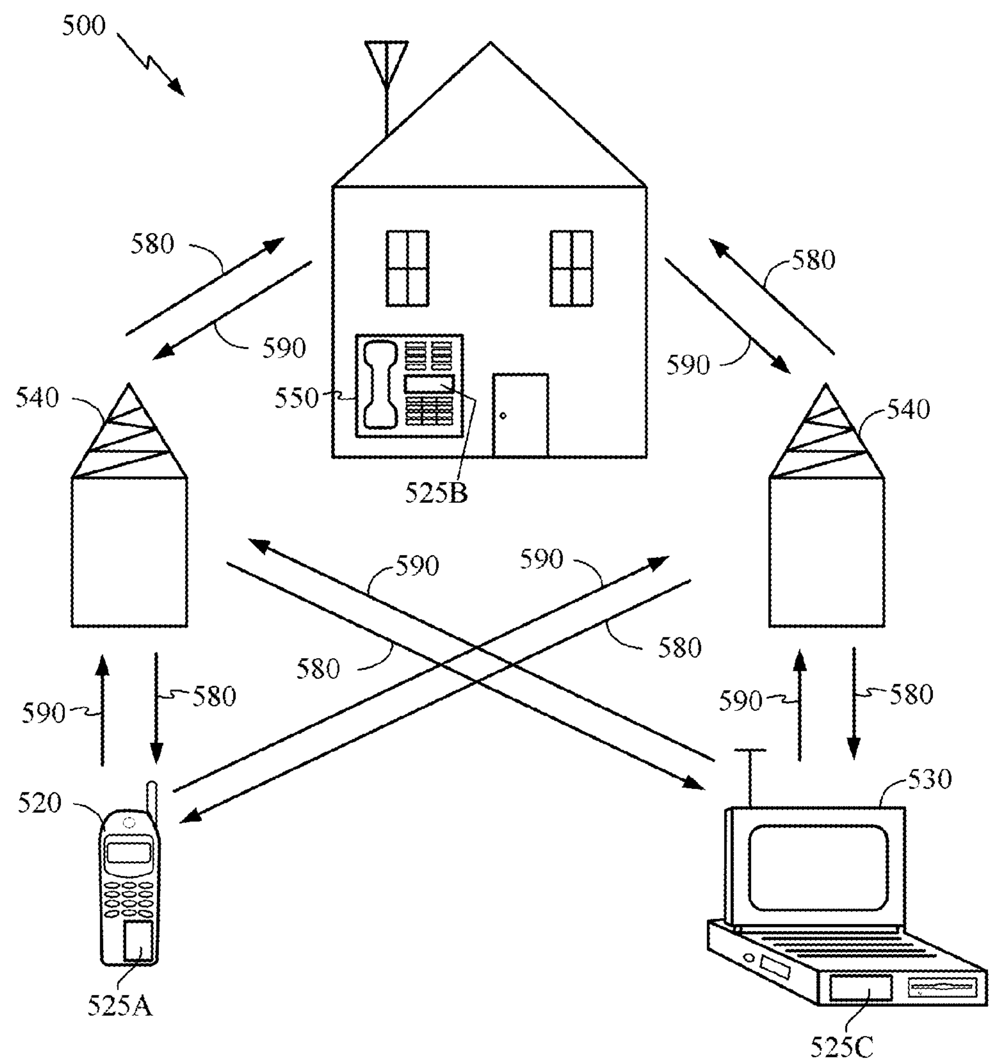
FIG. 5 is a block diagram showing an exemplary wireless communication system in which a configuration of the disclosure may be advantageously employed.

FIG. 5 is a block diagram showing an exemplary wireless communication system 500 in which an aspect of the disclosure may be advantageously employed. For purposes of illustration, FIG. 5 shows three remote units 520, 530, and 550 and two base stations 540. It will be recognized that wireless communication systems may have many more remote units and base stations. Remote units 520, 530, and 550 include IC devices 525A, 525C and 525B that include the disclosed MTJ device. It will be recognized that other devices may also include the disclosed MTJ device, such as the base stations, switching devices, and network equipment. FIG. 5 shows forward link signals 580 from the base station 540 to the remote units 520, 530, and 550 and reverse link signals 590 from the remote units 520, 530, and 550 to base stations 540.

In FIG. 5, remote unit 520 is shown as a mobile telephone, remote unit 530 is shown as a portable computer, and remote unit 550 is shown as a fixed location remote unit in a wireless local loop system. For example, the remote units may be a mobile phone, a hand-held personal communication systems (PCS) units, a portable data unit such as a personal data assistant, a GPS enabled device, a navigation device, a set top box, a music players, a video player, an entertainment unit, a fixed location data units such as meter reading equipment, or other devices that store or retrieve data or computer instructions, or combinations thereof. Although FIG. 5 illustrates remote units according to the teachings of the disclosure, the disclosure is not limited to these exemplary illustrated units. Aspects of the disclosure may be suitably employed in many devices, which include the disclosed MTJ devices.

Figure 6:
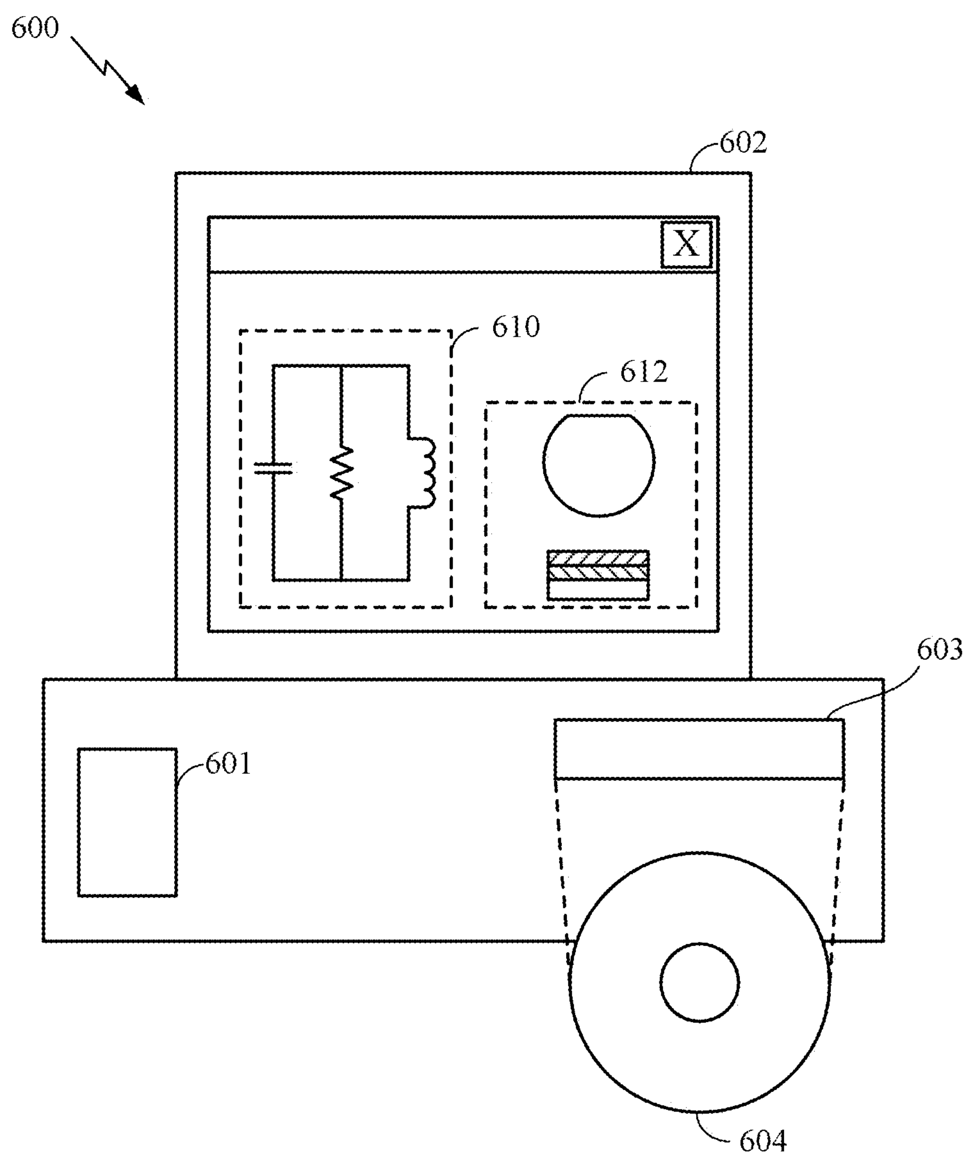
FIG. 6 is a block diagram illustrating a design workstation used for circuit, layout, and logic design of a semiconductor component according to one configuration.

FIG. 6 is a block diagram illustrating a design workstation used for circuit, layout, and logic design of a semiconductor component, such as the MTJ device disclosed above. A design workstation 600 includes a hard disk 601 containing operating system software, support files, and design software such as Cadence or OrCAD. The design workstation 600 also includes a display 602 to facilitate design of a circuit 610 or a semiconductor component 612 such as a MTJ device. A storage medium 604 is provided for tangibly storing the circuit design 610 or the semiconductor component 612. The circuit design 610 or the semiconductor component 612 may be stored on the storage medium 604 in a file format such as GDSII or GERBER. The storage medium 604 may be a CD-ROM, DVD, hard disk, flash memory, or other appropriate device. Furthermore, the design workstation 600 includes a drive apparatus 603 for accepting input from or writing output to the storage medium 604.

Data recorded on the storage medium 604 may include specify logic circuit configurations, pattern data for photolithography masks, or mask pattern data for serial write tools such as electron beam lithography. The data may further include logic verification data such as timing diagrams or net circuits associated with logic simulations. Providing data on the storage medium 604 facilitates the design of the circuit design 610 or the semiconductor component 612 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

It should be appreciated that memory devices including the MTJ storage elements described herein may be included within a mobile phone, portable computer, hand-held personal communication system (PCS) unit, portable data units such as personal data assistants (PDAs), GPS enabled devices, navigation devices, set top boxes, music players, video players, entertainment units, fixed location data units such as meter reading equipment, or any other device that stores or retrieves data or computer instructions, or any combination thereof. Accordingly, aspects of the disclosure may be suitably employed in any device, which includes active integrated circuitry including memory having MTJ storage elements as disclosed herein.

Further, it should be appreciated that various memory devices can include an array of MTJ storage elements as disclosed herein. Additionally, the MTJ storage elements may be used in various other applications, such as in logic circuits. Accordingly, although potions of the foregoing disclosure discuss the stand-alone MTJ storage element, it will be appreciated that various aspects can include devices into which the MTJ storage element is integrated.

Accordingly, aspects can include machine-readable media or computer-readable media embodying instructions which when executed by a processor transform the processor and any other cooperating elements into a machine for performing the functionalities described herein as provided for by the instructions.

While the foregoing disclosure shows illustrative aspects, it should be noted that various changes and modifications could be made herein without departing from the scope of the disclosure as defined by the appended claims. The functions, steps and/or actions of the method claims in accordance with the aspects described herein need not be performed in any particular order. Furthermore, although elements of the aspects may be described or claimed in the singular, the plural is contemplated unless limitation to the singular is explicitly stated.

Although the present disclosure and its advantages have been described in detail, it should be understood that various changes, substitutions and alterations can be made herein without departing from the technology of the disclosure as defined by the appended claims. For example, relational terms, such as "above," "below," "top" and "bottom" are used with respect to a substrate or electronic device. Of course, if the substrate or electronic device is inverted, above becomes below, top becomes bottom and vice versa. Additionally, if oriented sideways, the terms "above," "below," "top" and "bottom" may refer to sides of a substrate or electronic device, for example.

The word "exemplary" is used herein to mean "serving as an example, instance, or illustration." Any aspect described herein as "exemplary" is not necessarily to be construed as preferred or advantageous over other aspects. Likewise, the term "aspects of the disclosure" does not require that all aspects of the disclosure include the discussed feature, advantage or mode of operation. The terminology used herein is for the purpose of describing particular aspects only and is not intended to be limiting of aspects of the disclosure.

As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A magnetic tunnel junction (MTJ) device, comprising:
- a pinned layer;
- a tunnel barrier layer on the pinned layer;
- a free layer on the tunnel barrier layer;
- a perpendicular magnetic anisotropic (PMA) enhancement layer on the free layer;
- a capping layer on the PMA enhancement layer; and
- a conductive path along a sidewall of the capping layer, the PMA enhancement layer, and the free layer, and electrically shorting only the capping layer, the PMA enhancement layer, and the free layer.

2. The MTJ device of claim 1, in which the conductive path comprises a re-deposited conductive material resulting from etching.

3. The MTJ device of claim 1, in which the conductive path comprises a deposited conductive material after etching.

4. The MTJ device of claim 1, in which the conductive path further comprises a plurality of vias.

5. The MTJ device of claim 1, in which the PMA enhancement layer comprises aluminum oxide, magnesium oxide, hafnium oxide, and tantalum oxide.

6. The MTJ device of claim 1, in which the MTJ device comprises a perpendicular MTJ (pMTJ) device.

7. The MTJ device of claim 1 integrated into a mobile phone, a set top box, a music player, a video player, an entertainment unit, a navigation device, a computer, a hand-held personal communication systems (PCS) unit, a portable data unit, and/or a fixed location data unit.

8. A method of fabricating a perpendicular magnetic tunnel junction (pMTJ) device, comprising:
- forming a capping layer, a perpendicular magnetic anisotropic (PMA) enhancement layer and a free layer; and
- forming a conductive layer along a sidewall of the capping layer, the PMA enhancement layer, and the free layer to short only the capping layer, the PMA enhancement layer and the free layer.

9. The method of claim 8, in which forming the conductive layer comprises etching the capping layer, the PMA enhancement layer, a tunnel barrier layer, and/or the free layer to induce re-depositing of the conductive layer on the capping layer, the PMA enhancement layer, and the free layer.

10. The method of claim 8, in which forming the conductive layer comprises depositing a conductive material on the capping layer, the PMA enhancement layer, and the free layer.

11. The method of claim 8, in which forming the conductive layer further comprises fabricating vias to couple the capping layer, through the PMA enhancement layer to the free layer.

12. The method of claim 8, further comprising integrating the pMTJ device into a mobile phone, a set top box, a music player, a video player, an entertainment unit, a navigation device, a computer, a hand-held personal communication systems (PCS) unit, a portable data unit, and/or a fixed location data unit.

13. A magnetic tunnel junction (MTJ) device, comprising:
- a pinned layer;
- a tunnel barrier layer on the pinned layer;
- a free layer on the tunnel barrier layer;
- a perpendicular magnetic anisotropic (PMA) enhancement layer on the free layer;
- a capping layer on the PMA enhancement layer; and
- means for electrically shorting only the capping layer, the PMA enhancement layer and the free layer arranged along a sidewall of the capping layer, the PMA enhancement layer, and the free layer.

14. The MTJ device of claim 13, in which the shorting means comprises a re-deposited conductive material resulting from etching.

15. The MTJ device of claim 13, in which the shorting means comprises a deposited conductive material after etching.

16. The MTJ device of claim 13, in which the shorting means further comprises a plurality of vias.

17. The MTJ device of claim 13, in which the PMA enhancement layer comprises aluminum oxide, magnesium oxide, hafnium oxide, and tantalum oxide.

18. The MTJ device of claim 13, in which the MTJ device comprises a perpendicular MTJ (pMTJ) device.

19. The MTJ device of claim 13 integrated into a mobile phone, a set top box, a music player, a video player, an entertainment unit, a navigation device, a computer, a hand-held personal communication systems (PCS) unit, a portable data unit, and/or a fixed location data unit.

20. A method of fabricating a perpendicular magnetic tunnel junction (pMTJ) device, comprising the steps of:

forming a capping layer, a perpendicular magnetic anisotropic (PMA) enhancement layer, and a free layer; and forming a conductive layer along a sidewall of the capping layer, the PMA enhancement layer, and the free layer to short only the capping layer, the PMA enhancement layer, and the free layer.

21. The method of claim 20, in which the step of forming the conductive layer comprises the step of etching the capping layer, the PMA enhancement layer, a tunnel barrier layer, and/or the free layer to induce re-depositing of the conductive layer on the capping layer, the PMA enhancement layer, and the free layer.

22. The method of claim 20, in which the step of forming the conductive layer further comprises the step of depositing a conductive material on the sidewall of the capping layer, the PMA enhancement layer, and the free layer.

23. The method of claim 20, in which the step of forming the conductive layer further comprises the step of fabricating vias to couple the capping layer, through the PMA enhancement layer to the free layer.

24. The method of claim 20, further comprising the step of integrating the pMTJ device into a mobile phone, a set top box, a music player, a video player, an entertainment unit, a navigation device, a computer, a hand-held personal communication systems (PCS) unit, a portable data unit, and/or a fixed location data unit.

* * * * *